(12) United States Patent
Takagi

(10) Patent No.: US 9,935,581 B2
(45) Date of Patent: Apr. 3, 2018

(54) HIGH-FREQUENCY SEMICONDUCTOR AMPLIFIER

(71) Applicant: Kabushiki Kaisha Toshiba, Minato-ku (JP)

(72) Inventor: Kazutaka Takagi, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 104 days.

(21) Appl. No.: 15/008,112

(22) Filed: Jan. 27, 2016

(65) Prior Publication Data

US 2016/0218678 A1    Jul. 28, 2016

(30) Foreign Application Priority Data

Jan. 28, 2015 (JP) .................................. 2015-014034

(51) Int. Cl.
*H03F 1/02* (2006.01)
*H03F 1/56* (2006.01)
(Continued)

(52) U.S. Cl.
CPC ........... *H03F 1/0205* (2013.01); *H01P 5/028* (2013.01); *H03F 1/56* (2013.01); *H03F 3/19* (2013.01);
(Continued)

(58) Field of Classification Search
CPC . H03F 1/0205; H03F 1/56; H03F 3/19; H03F 3/217; H01P 5/028
(Continued)

(56) References Cited

U.S. PATENT DOCUMENTS 5,352,990 A   10/1994  Goto
5,473,281 A   12/1995  Honjo
(Continued)

FOREIGN PATENT DOCUMENTS

EP    2 637 302 A1   9/2013
JP    2009-207060    9/2009
(Continued)

OTHER PUBLICATIONS

Office Action dated Nov. 10, 2016 in Japanese Patent Application No. 2015-014034 (with English language translation).
(Continued)

*Primary Examiner* — Stephen E Jones
*Assistant Examiner* — Scott S Outten
(74) *Attorney, Agent, or Firm* — Oblon, McClelland, Maier & Neustadt, L.L.P.

(57) ABSTRACT

According to one embodiment, a high-frequency semiconductor amplifier includes an input terminal, an input matching circuit, a high-frequency semiconductor amplifying element, an output matching circuit and an output terminal. The input terminal is inputted with a fundamental signal. The fundamental signal has a first frequency band and a first center frequency in the first frequency band. The input matching circuit includes an input end and an output end. The input end of the input matching circuit is connected to the input terminal. The high-frequency semiconductor amplifying element includes an input end and an output end. The input end of the high-frequency semiconductor amplifying element is connected to the output end of the input matching circuit. The high-frequency semiconductor amplifying element is configured to amplify the fundamental signal.

14 Claims, 10 Drawing Sheets

(51) Int. Cl.
*H03F 3/19* (2006.01)
*H03F 3/217* (2006.01)
*H01P 5/02* (2006.01)
*H01L 23/66* (2006.01)
*H03F 3/60* (2006.01)
*H01L 23/00* (2006.01)
*H01P 1/24* (2006.01)
*H01P 1/28* (2006.01)

(52) U.S. Cl.
CPC ............. *H03F 3/217* (2013.01); *H01L 23/66* (2013.01); *H01L 24/48* (2013.01); *H01L 24/49* (2013.01); *H01L 2223/6611* (2013.01); *H01L 2223/6627* (2013.01); *H01L 2223/6655* (2013.01); *H01L 2224/48091* (2013.01); *H01L 2224/49111* (2013.01); *H01L 2224/49175* (2013.01); *H01L 2924/00014* (2013.01); *H01L 2924/142* (2013.01); *H01P 1/24* (2013.01); *H01P 1/28* (2013.01); *H03F 3/60* (2013.01); *H03F 2200/451* (2013.01)

(58) Field of Classification Search
USPC .......................................................... 333/33
See application file for complete search history.

(56) References Cited

U.S. PATENT DOCUMENTS

| | | | |
|---|---|---|---|
| 6,396,348 B1 | 5/2002 | Honjo | |
| 8,183,955 B2 * | 5/2012 | Dolmans | H01P 5/028 333/33 |
| 9,270,235 B2 | 2/2016 | Aoki et al. | |
| 2002/0105384 A1 | 8/2002 | Dent | |
| 2009/0309671 A1 | 12/2009 | Adams et al. | |
| 2013/0234794 A1 | 9/2013 | Takagi | |
| 2014/0218105 A1 | 8/2014 | Aoki et al. | |
| 2015/0381140 A1 * | 12/2015 | Embar | H03F 3/217 333/33 |

FOREIGN PATENT DOCUMENTS

| | | |
|---|---|---|
| JP | 2010-154235 | 7/2010 |
| JP | 2013-187772 A | 9/2013 |
| JP | 2013-187773 | 9/2013 |
| JP | 2013-187774 | 9/2013 |
| JP | 2013-187775 | 9/2013 |
| JP | 2014-150462 A | 8/2014 |
| JP | 2014-197872 A | 10/2014 |
| JP | 2015-149626 | 8/2015 |
| JP | 2015-149627 | 8/2015 |
| WO | WO 2013/132980 A1 | 9/2013 |

OTHER PUBLICATIONS

Extended European Search Report dated Jun. 21, 2016 in Patent Application No. 16152920.1.

\* cited by examiner

HIGH-FREQUENCY SEMICONDUCTOR AMPLIFIER

CROSS-REFERENCE TO RELATED APPLICATIONS

This application is based upon and claims the benefit of priority from Japanese Patent Application No. 2015-014034, filed on Jan. 28, 2015; the entire contents of which are incorporated herein by reference.

FIELD

Embodiments described herein relate generally to a high-frequency semiconductor amplifier.

BACKGROUND

An amplifier operating in the high-frequency band of 1 GHz or more has recently been under active development. Such an amplifier is used in e.g. radio communication equipment, mobile communication base stations, and radar devices. This amplifier is required to amplify and transmit signals in the high-frequency band at high power-added efficiency.

In a microwave semiconductor amplifying element, high efficiency operation called class-F mode can be achieved when the load impedance for the second harmonic seen from the output electrode end of the semiconductor amplifying element is made near-short, and the load impedance for the third harmonic is made near-open. In a known technique, an open-stub that is a tip-open transmission line of ⅛ wavelength of the fundamental is connected to the output electrode end of the semiconductor amplifying element so that the load impedance for the second harmonic seen from the output electrode end of the semiconductor amplifying element is made near-short. An open-stub that is tip-open transmission line of 1/12 wavelength of the fundamental is connected to the output electrode end of the semiconductor amplifying element through a transmission line of ⅛ wavelength of the fundamental so that the load impedance for the third harmonic is made near-open.

Furthermore, in a microwave semiconductor amplifying element, high efficiency operation called inverse class-F mode can be achieved when the load impedance for the second harmonic seen from the output electrode end of the semiconductor amplifying element is made near-open, and the load impedance for the third harmonic is made near-short. In a known technique, the impedance for the second harmonic is controlled without affecting the fundamental by a harmonic impedance adjustment line so that the load impedance for the second harmonic is made near-open.

DETAILED DESCRIPTION

Figure 1:
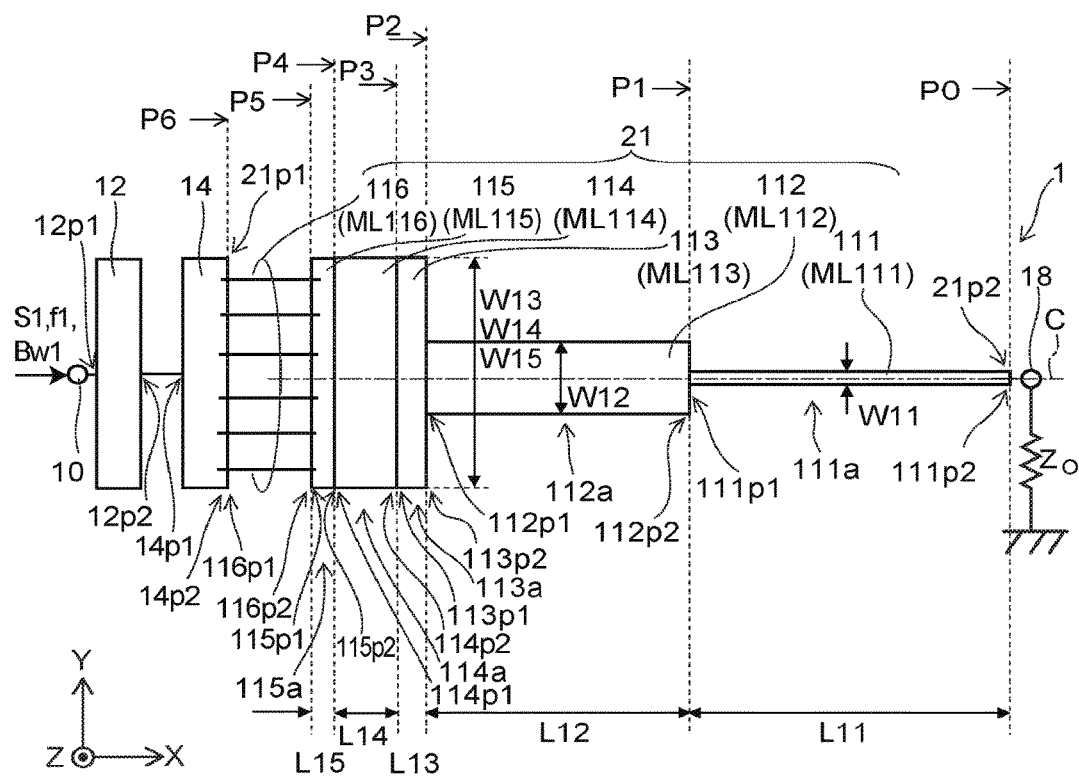
FIG. 1 is a schematic view showing the configuration of a high-frequency semiconductor amplifier according to a first embodiment.

According to one embodiment, a high-frequency semiconductor amplifier includes an input terminal, an input matching circuit, a high-frequency semiconductor amplifying element, an output matching circuit and an output terminal. The input terminal is inputted with a fundamental signal. The fundamental signal has a first frequency band and a first center frequency in the first frequency band. The input matching circuit includes an input end and an output end. The input end of the input matching circuit is connected to the input terminal. The high-frequency semiconductor amplifying element includes an input end and an output end. The input end of the high-frequency semiconductor amplifying element is connected to the output end of the input matching circuit. The high-frequency semiconductor amplifying element is configured to amplify the fundamental signal. The output matching circuit includes an input end and an output end. The input end of the output matching circuit is connected to the output end of the high-frequency semiconductor amplifying element. The output terminal is connected to the output end of the output matching circuit. The output matching circuit includes a first transmission line, a second transmission line, a third transmission line, a fourth transmission line, a fifth transmission line and a wire part. The first transmission line includes an input end and an output end. The output end of the first transmission line is connected to the output end of the output matching circuit. The first transmission line has an electrical length of 72 degrees or more and 108 degrees or less at the first center frequency. A characteristic impedance of the first transmission line is lower than a load impedance of an external load. The external load is connected in parallel to the output terminal. The load impedance is 50Ω. The second transmission line includes an input end and an output end. The output end of the second transmission line is connected to the input end of the first transmission line. The second transmission line has an electrical length of 72 degrees or more and 108 degrees or less at the first center frequency. A characteristic impedance of the second transmission line is lower than the characteristic impedance of the first transmission line. The third transmission line includes an input end and an output end. The output end of the third transmission line is connected to the input end of the second transmission line. The third transmission line has an electrical length of 24 degrees or more and 36 degrees or less at the first center frequency. A characteristic impedance of the third transmission line is lower than the characteristic impedance of the second transmission line. The fourth transmission line includes an input end and an output end. The output end of the fourth transmission line is connected to the input end of the third transmission line. The fourth transmission line has an electrical length of 12 degrees or more and 18 degrees or less at the first center frequency. A characteristic impedance of the fourth transmission line is lower than the characteristic impedance of the first transmission line. The characteristic impedance of the fourth transmission line is higher than resistance of a desired load impedance. The desired load impedance is provided to the high-frequency semiconductor amplifying element. A line width along a second direction of the fourth transmission line is 0.8 times or more and 1.2 times or less of line width along the second direction of the third transmission line. The fifth transmission line includes an input end and an output end. The output end of the fifth transmission line is connected to the input end of the fourth transmission line. The fifth transmission line has an electrical length of 12 degrees or more and 18 degrees or less at the first center frequency. A characteristic impedance of the fifth transmission line is equal to the resistance of the desired load impedance. The desired load impedance is provided to the high-frequency semiconductor amplifying element. The wire part includes an input end and an output end. The output end of the wire part is connected to the input end of the fifth transmission line. The input end of the wire part is connected to the input end of the output matching circuit.

Embodiments of the invention will now be described with reference to the drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In this specification and the drawings, components similar to those described previously with reference to earlier figures are labeled with like reference numerals, and the detailed description thereof is omitted appropriately.

First Embodiment

FIG. 1 is a schematic view showing the configuration of a high-frequency semiconductor amplifier according to this embodiment.

First, the configuration of the high-frequency semiconductor amplifier according to this embodiment is described.

As shown in FIG. 1, the high-frequency semiconductor amplifier 1 is composed of an input terminal 10 inputted a fundamental signal S1 including the first frequency band Bw1, an input matching circuit 12 connected to the input terminal 10, a high-frequency semiconductor amplifying element 14 connected to the input matching circuit 12, an output matching circuit 21 connected to the high-frequency semiconductor amplifying element 14, and an output terminal 18 connected to the output matching circuit 21. A high-frequency fundamental signal S1 having a first frequency band Bw1 is inputted to the input terminal 10. The input end $12p1$ of the input matching circuit 12 is connected to the input terminal 10. The input end $14p1$ of the high-frequency semiconductor amplifying element 14 is connected to the output end $12p2$ of the input matching circuit 12. The output end $14p2$ of the high-frequency semiconductor amplifying element 14 is connected to the input end $21p1$ of the output matching circuit 21. The output terminal 18 is connected to the output end $21p2$ of the output matching circuit 21.

The input matching circuit 12 is a circuit for matching the power supply impedance with the input impedance of the high-frequency semiconductor amplifying element 14. The high-frequency semiconductor amplifying element 14 is an element for amplifying the high-frequency fundamental signal S1. An external load Zo is connected in parallel externally seen from the output terminal 18. The load impedance m0 of the external load Zo is e.g. 50Ω.

The DC circuit for supplying voltage to the high-frequency semiconductor amplifying element 14 is not shown.

The output matching circuit 21 is formed from a microstrip line 111 (ML111), a microstrip line 112 (ML112), a microstrip line 113 (ML113), a microstrip line 114 (ML114), a microstrip line 115 (ML115), and a wire part 116. The microstrip line is one example of a transmission line. The wire part 116 is formed from e.g. six wires. The output matching circuit 21 is a circuit for transforming the load impedance m0 of the external load Zo seen from the output terminal 18 to a desired load impedance md provided to the high-frequency semiconductor amplifying element 14. The desired load impedance and is determined by e.g. the load-pull measurement. The desired load impedance md is e.g. $(1+j1)\Omega$.

In the following, for convenience of description, an XYZ orthogonal coordinate system is adopted in this specification. More specifically, in FIG. 1, the extending direction of the microstrip line 111 is referred to as "X-direction". A direction orthogonal thereto is referred to as "Y-direction". The direction opposite to the "X-direction" is referred to as "−X-direction". The direction opposite to the "Y-direction" is referred to as "−Y-direction". The plane including the X-direction and the Y-direction is referred to as X-Y plane. The upward direction perpendicular to this X-Y plane is referred to as "Z-direction".

In this specification, the fundamental signal S1 has a first frequency band Bw1. The center frequency in the first frequency band Bw1 is referred to as first center frequency f1 or "fundamental frequency f1". The wavelength corresponding to the "fundamental frequency f1" is referred to as "fundamental wavelength λ1". The frequency of twice the "fundamental frequency f1" is referred to as "second harmonic frequency f2". The wavelength corresponding to the "second harmonic frequency f2" is referred to as "second harmonic wavelength λ2". The frequency of three times the "fundamental frequency f1" is referred to as "third harmonic frequency f3". The wavelength corresponding to the "third harmonic frequency f3" is referred to as "third harmonic wavelength λ3".

The microstrip line 111, the microstrip line 112, the microstrip line 113, the microstrip line 114, and the microstrip line 115 schematically show the pattern of microstrip lines.

The center line splitting the microstrip line 112 in the Y-direction, the center line splitting the microstrip line 113 in the Y-direction, the center line splitting the microstrip line 114 in the Y-direction, and the center line splitting the microstrip line 115 in the Y-direction overlap the center line C splitting the microstrip line 111 in the Y-direction.

The reference plane P0 is a plane tangent to the X-direction end part of the microstrip line 111 and perpendicular to the X-direction. The reference plane P1 is a plane tangent to the X-direction end part of the microstrip line 112 and perpendicular to the X-direction. The reference plane P2 is a plane tangent to the X-direction end part of the microstrip line 113 and perpendicular to the X-direction. The reference plane P3 is a plane tangent to the X-direction end part of the microstrip line 114 and perpendicular to the X-direction. The reference plane P4 is a plane tangent to the X-direction end part of the microstrip line 115 and perpendicular to the X-direction. The reference plane P5 is a plane tangent to the −X-direction end part of the microstrip line 115 and perpendicular to the X-direction.

TABLE 1 is a table illustrating the electrical characteristics and dimensions of the microstrip lines in the high-frequency semiconductor amplifier 1 according to this embodiment.

TABLE 1

|  | ML111 | ML112 | ML113 | ML114 | ML115 |
| --- | --- | --- | --- | --- | --- |
| Zc11-15 (Ω) | 32.20 | 8.42 | 1.34 | 5.86 | 1.38 |
| EL11-15 (°) | 85.0 | 75.5 | 28.0 | 15.0 | 16.0 |
| εr11-15 | 10 | 10 | 180 | 10 | 90 |
| t11-15 (μm) | 150 | 150 | 270 | 280 | 190 |
| W11-15 (mm) | 0.310 | 1.810 | 5.010 | 5.080 | 5.050 |
| L11-15 (mm) | 8.690 | 7.050 | 0.610 | 1.380 | 0.490 |

The X-direction output end 111$p2$ of the microstrip line 111 (ML111) is connected to the output terminal 18 (the output end 21$p2$ of the output matching circuit 21) at the reference plane P0. The microstrip line 111 has a line width W11 of 0.310 mm along the Y-direction. The microstrip line 111 extends from the reference plane P0 by a line length L11 of 8.690 mm along the −X-direction. The input end 111$p1$ of the microstrip line 111 is connected to the output end 112$p2$ of the microstrip line 112 at the reference plane P1 to which the microstrip line 111 extends. The characteristic impedance Zc11 of the microstrip line 111 is 32.2Ω. The relative permittivity εr11 of the microstrip line 111 is 10. The substrate thickness t11 of the microstrip line 111 along the Z-direction is 150 μm. The characteristic impedance Zc11 is lower than the load impedance m0 of the external load Zo. At the fundamental frequency (first center frequency) f1, the electrical length EL11 of the microstrip line 111 is 85 degrees, being approximately ¼ times the fundamental wavelength λ1. The electrical length EL11 may be 72 degrees or more and 108 degrees or less at the fundamental frequency f1.

The microstrip line 112 (ML112) extends from the reference plane P1 by a line length L12 of 7.050 mm along the −X-direction with a line width W12 of 1.810 mm along the Y-direction. The input end 112$p1$ of the microstrip line 112 is connected to the output end 113$p2$ of the microstrip line 113 at the reference plane P2 to which the microstrip line 112 extends. The characteristic impedance Zc12 of the microstrip line 112 is 8.42Ω. The relative permittivity εr12 of the microstrip line 112 is 10. The substrate thickness t12 of the microstrip line 112 is 150 μm. The characteristic impedance Zc12 of the microstrip line 112 is lower than the characteristic impedance Zc11. At the fundamental frequency f1, the electrical length EL12 of the microstrip line 112 is 75.5 degrees, being approximately ¼ times the fundamental wavelength λ1. The electrical length EL12 may be 72 degrees or more and 108 degrees or less at the fundamental frequency f1.

The microstrip line 113 (ML113) extends from the reference plane P2 by a line length L13 of 0.610 mm along the −X-direction with a line width W13 of 5.010 mm along the Y-direction. The input end 113$p1$ of the microstrip line 113 is connected to the output end 114$p2$ of the microstrip line 114 at the reference plane P3 to which the microstrip line 113 extends. The characteristic impedance Zc13 of the microstrip line 113 is 1.34Ω. The relative permittivity εr13 of the microstrip line 113 is 180. The substrate thickness t13 of the microstrip line 113 along the Z-direction is 270 μm. The characteristic impedance Zc13 of the microstrip line 113 is lower than the characteristic impedance Zc12. At the fundamental frequency f1, the electrical length EL13 of the microstrip line 113 is 28 degrees, being approximately 1/12 times the fundamental wavelength λ1. The electrical length EL13 may be 24 degrees or more and 36 degrees or less at the fundamental frequency f1.

The microstrip line 114 (ML114) extends from the reference plane P3 by a line length L14 of 1.38 mm along the −X-direction with a line width W14 of 5.080 mm along the Y-direction. The input end 114$p1$ of the microstrip line 114 is connected to the output end 115$p2$ of the microstrip line 115 at the reference plane P4 to which the microstrip line 114 extends. The characteristic impedance Zc14 of the microstrip line 114 is 5.86Ω. The relative permittivity εr14 of the microstrip line 114 is 10. The substrate thickness t14 of the microstrip line 114 along the Z-direction is 280 μm. The characteristic impedance Zc14 of the microstrip line 114 is lower than the characteristic impedance Zc11. The characteristic impedance Zc14 is higher than the resistance R of the desired load impedance and provided to the high-frequency semiconductor amplifying element 14 at the fundamental frequency f1. The line width W14 along the Y-direction is 0.8 times or more and 1.2 times or less of the line width W13 along the Y-direction. At the fundamental frequency f1, the electrical length EL14 of the microstrip line 114 is 15 degrees, being approximately 1/24 times the fundamental wavelength λ1. The electrical length EL14 may be 12 degrees or more and 18 degrees or less at the fundamental frequency f1.

The microstrip line 115 (ML115) extends from the reference plane P4 by a line length L15 of 0.49 mm along the −X-direction with a line width W15 of 5.05 mm along the Y-direction. The input end 115$p1$ of the microstrip line 115 is connected to the output end 116$p2$ of the wire part 116 at the reference plane P5 to which the microstrip line 115 extends. The characteristic impedance Zc15 of the microstrip line 115 is 1.38Ω. The relative permittivity εr15 of the microstrip line 115 is 90. The substrate thickness t15 of the microstrip line 115 along the Z-direction is 190 μm. The characteristic impedance Zc15 is equal to the resistance R of the desired load impedance and provided to the high-frequency semiconductor amplifying element 14 at the fundamental frequency f1. The electrical length EL15 of the microstrip line 115 is 16 degrees, being approximately 1/24 times the fundamental wavelength λ1. The electrical length EL15 may be 12 degrees or more and 18 degrees or less at the fundamental frequency f1.

The wire part 116 is provided between the microstrip line 115 and the high-frequency semiconductor amplifying element 14. The wire part 116 connects the microstrip line 115 and the high-frequency semiconductor amplifying element 14. The wire part 116 is formed from e.g. six wires.

The input end 116p1 of the wire part 116 is connected to the input end 21p1 of the output matching circuit 21.

The characteristic impedance Zc13 of the microstrip line 113 is 0.8 times or more and 1.2 times or less of the characteristic impedance Zc15 of the microstrip line 115. The characteristic impedance Zc14 of the microstrip line 114 is higher than the characteristic impedance Zc13 of the microstrip line 113.

The relative permittivity εr13 of the substrate of the microstrip line 113 is 1.6 times or more and 2.4 times or less of the relative permittivity εr15 of the substrate of the microstrip line 115. The relative permittivity εr14 of the substrate of the microstrip line 114 is 0.08 times or more and 0.12 times or less of the relative permittivity εr15 of the substrate of the microstrip line 115. The relative permittivity εr14 of the substrate of the microstrip line 114 is equal to the relative permittivity εr12 of the substrate of the microstrip line 112. The relative permittivity εr12 of the substrate of the microstrip line 112 is 0.08 times or more and 0.12 times or less of the relative permittivity εr15 of the substrate of the microstrip line 115. The relative permittivity εr15 of the substrate of the microstrip line 115 is higher than the relative permittivity εr14 of the substrate of the microstrip line 114.

The substrate thickness t14 along the Z-direction of the microstrip line 114 is 1.6 times or more and 2.4 times or less of the substrate thickness t12 along the Z-direction of the microstrip line 112. The substrate thickness t13 along the Z-direction of the microstrip line 113 is 0.8 times or more and 1.2 times or less of the substrate thickness t14 along the Z-direction of the microstrip line 114.

The line width W14 along the Y-direction of the microstrip line 114 is 0.8 times or more and 1.2 times or less of the line width W15 along the Y-direction of the microstrip line 115. The line width W13 along the Y-direction of the microstrip line 113 is 0.8 times or more and 1.2 times or less of the line width W15 along the Y-direction of the microstrip line 115.

Next, the operation of the high-frequency semiconductor amplifier 1 according to this embodiment is described.

Figure 2:
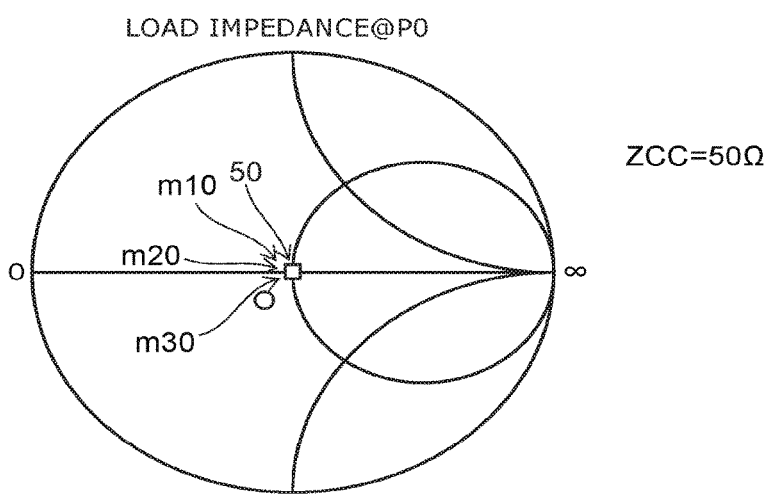
FIG. 2 is an impedance chart (Smith chart) illustrating the load impedance seen from the reference plane P0 shown in FIG. 1.

FIG. 2 is an impedance chart (Smith chart) illustrating the load impedance seen from the reference plane P0 shown in FIG. 1.

Figure 3A:
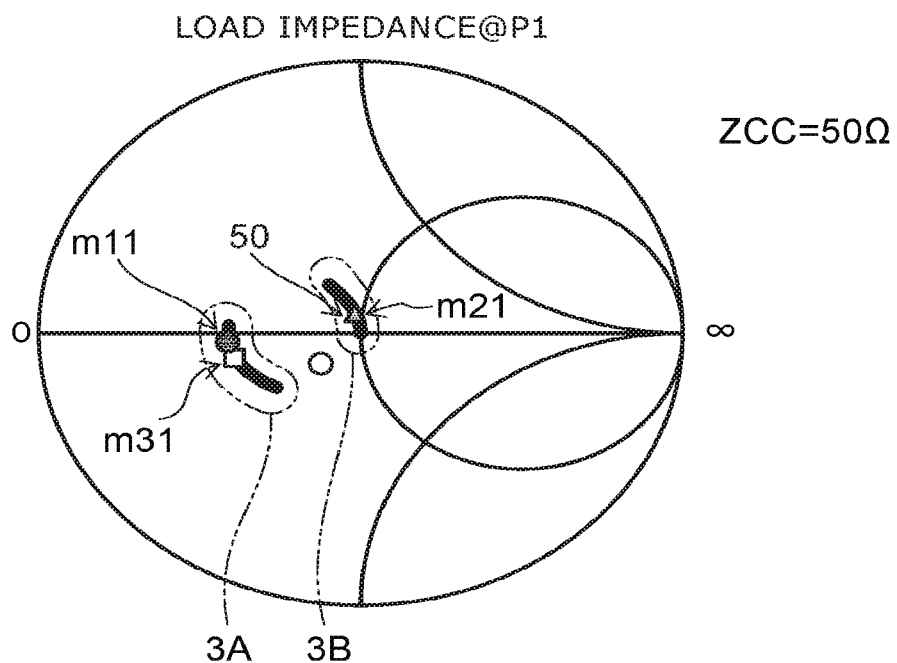
FIGS. 3A and 3B are impedance charts illustrating the load impedance seen from the reference plane P1 shown in FIG. 1.
Figure 3B:
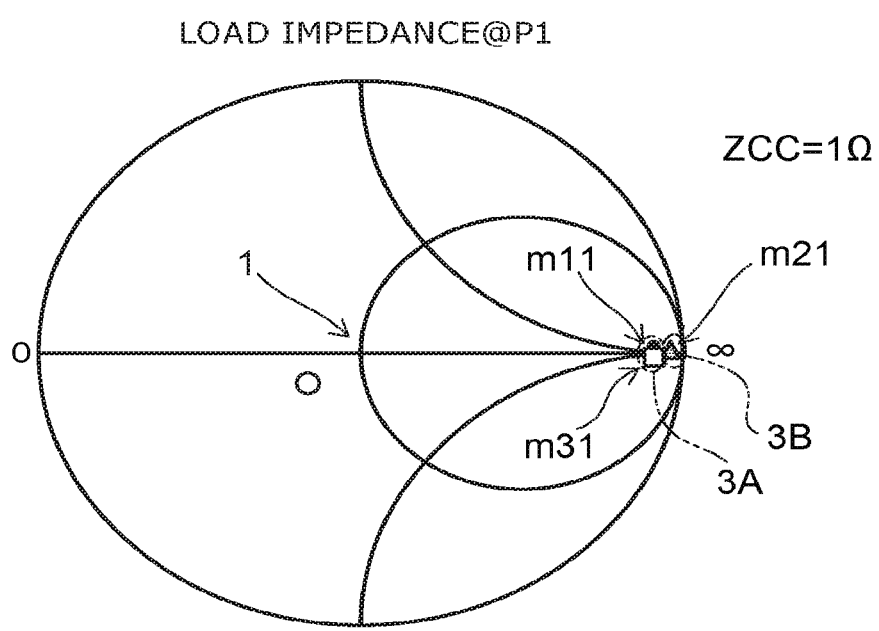

FIGS. 3A and 3B are impedance charts illustrating the load impedance seen from the reference plane P1 shown in FIG. 1.

Figure 4:
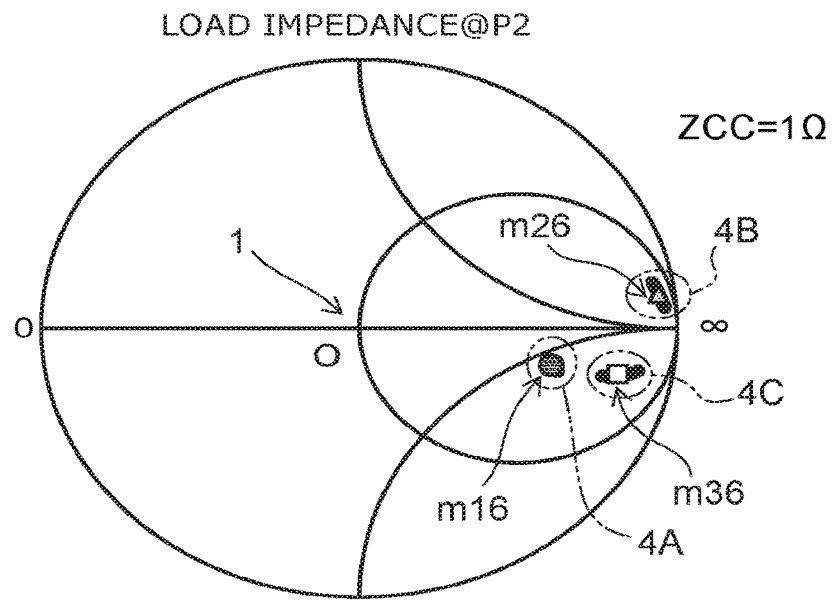
FIG. 4 is an impedance chart illustrating the load impedance seen from the reference plane P2 shown in FIG. 1.

FIG. 4 is an impedance chart illustrating the load impedance seen from the reference plane P2 shown in FIG. 1.

Figure 5:
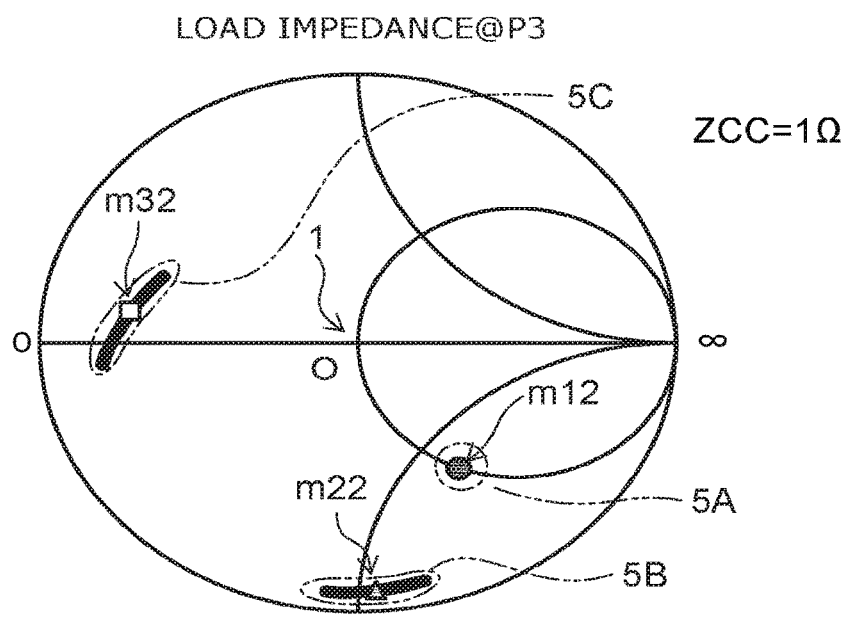
FIG. 5 is an impedance chart illustrating the load impedance seen from the reference plane P3 shown in FIG. 1.

FIG. 5 is an impedance chart illustrating the load impedance seen from the reference plane P3 shown in FIG. 1.

Figure 6:
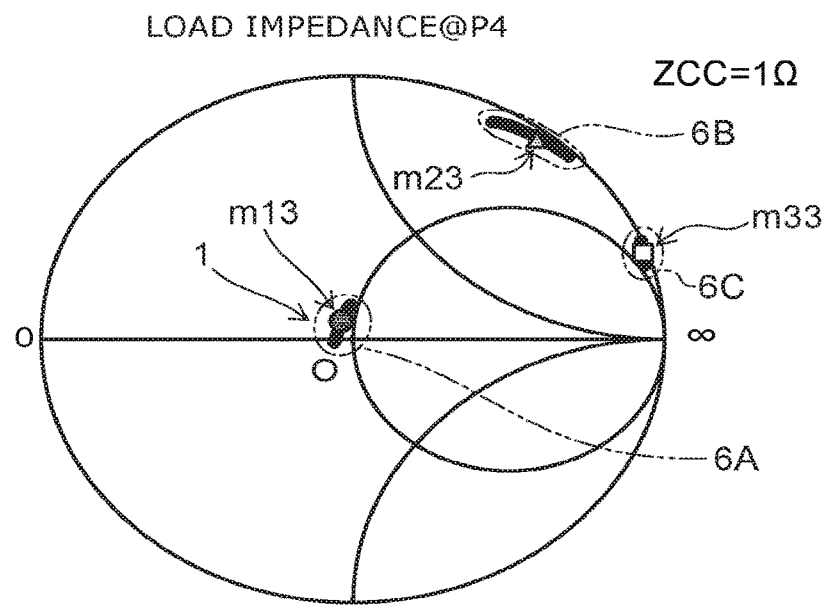
FIG. 6 is an impedance chart illustrating the load impedance seen from the reference plane P4 shown in FIG. 1.

FIG. 6 is an impedance chart illustrating the load impedance seen from the reference plane P4 shown in FIG. 1.

Figure 7:
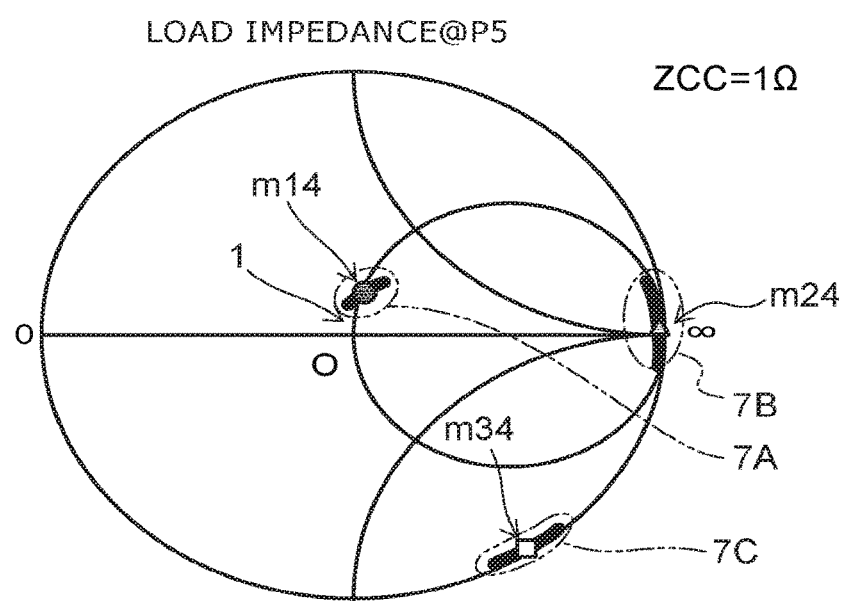
FIG. 7 is an impedance chart illustrating the load impedance seen from the reference plane P5 shown in FIG. 1.
Figure 8:
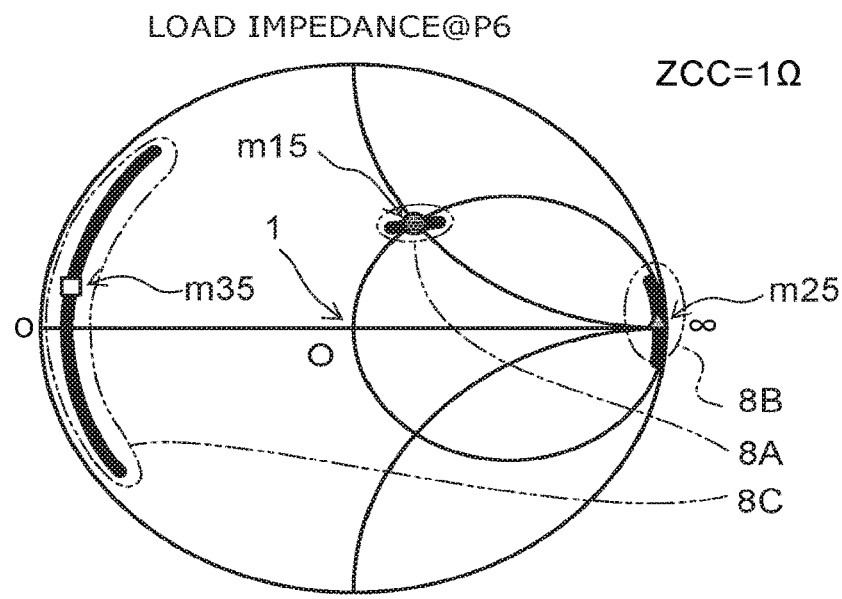
FIG. 8 is an impedance chart illustrating the load impedance seen from the reference plane P6 shown in FIG. 1.

FIG. 7 is an impedance chart illustrating the load impedance seen from the reference plane P5 shown in FIG. 1. FIG. 8 is an impedance chart illustrating the load impedance seen from the reference plane P6 shown in FIG. 1.

The impedance chart of FIG. 2 is normalized so that the center point O represents 50Ω (characteristic impedance ZCC=50Ω).

The impedance chart of FIG. 3A is normalized so that the center point O represents 50Ω (ZCC=50Ω). The impedance chart of FIG. 3B is normalized so that the center point O represents 1Ω (ZCC=1Ω).

The impedance charts of FIGS. 4 to 8 are normalized so that the center point O represents 1Ω (ZCC=1Ω).

In FIGS. 2 to 8, the symbols m10-m15 represent the load impedance at the fundamental frequency f1. The symbols m20-m25 represent the load impedance at the second harmonic frequency f2. The symbols m30-m35 represent the load impedance at the third harmonic frequency f3.

This example shows the case where the load impedance m15 at the fundamental frequency f1 seen from the reference plane P5 is transformed to approximately (1+j1)Ω.

As shown in FIG. 2, the side of the output terminal 18 connected with the external load Zo is seen from the reference plane P0. Then, the load impedance m10 at the fundamental frequency f1, the load impedance m20 at the second harmonic frequency f2, and the load impedance m30 at the third harmonic frequency f3 are located at the center point O near 50Ω.

The load impedance at the fundamental, second harmonic, and third harmonic frequencies can be determined by measurement and simulation, and indicated on the impedance chart.

As shown in TABLE 1, the electrical length of the microstrip line 111 at the fundamental frequency f1 is 85 degrees. The electrical length of 85 degrees corresponds to approximately a quarter wavelength. Thus, the microstrip line 111 operates like a quarter wavelength transformer.

The characteristic impedance Zc11 of the microstrip line 111 is lower than 50Ω, which is the load impedance m0 of the external load Zo. Thus, as shown in FIGS. 3A and 3B, the load impedance m11 at the fundamental frequency f1 seen from the reference plane P1 is transformed to an impedance lower than 50Ω, which is the load impedance m0 of the external load Zo. The load impedance in the first frequency band Bw1 is also transformed to a neighborhood portion including the load impedance m11. This portion is indicated as portion 3A in FIGS. 3A and 3B.

The electrical length EL11 of the microstrip line 111 is approximately a three-quarter wavelength at the third harmonic frequency f3. Thus, the load impedance m31 at the third harmonic frequency f3 is transformed to the portion 3A. The signal having a frequency of three times that of the fundamental signal S1 is referred to as third harmonic signal S3. The load impedance for the third harmonic signal S3 having a frequency band is also transformed to the portion 3A having a low impedance.

The electrical length EL11 of the microstrip line 111 is approximately a two-quarter wavelength at the second harmonic frequency f2. Thus, the load impedance m21 at the second harmonic frequency f2 remains near 50Ω without substantial change. This portion near 50Ω is indicated as portion 3B in FIGS. 3A and 3B. At this stage, only the load impedance m21 for the second harmonic is separated from the load impedance m11 for the fundamental and the load impedance m31 for the third harmonic.

As shown in TABLE 1, the electrical length of the microstrip line 112 at the fundamental frequency f1 is 75.5 degrees, corresponding to approximately a quarter wavelength. Thus, the microstrip line 112 operates like a quarter wavelength transformer.

The characteristic impedance Zc12 of the microstrip line 112 is lower than the load impedance m11 at the fundamental frequency f1 seen from the reference plane P1. Thus, as shown in FIG. 4, the load impedance m16 at the fundamental frequency f1 seen from the reference plane P2 is transformed to a lower value than the load impedance m11 at the fundamental frequency f1 seen from the reference plane P1. This portion of the transformed impedance is indicated as portion 4A in FIG. 4. The microstrip line 112 corresponds to approximately a three-quarter wavelength at the third harmonic frequency f3. Thus, the load impedance m36 at the third harmonic frequency f3 is also transformed to a portion 4C having a low impedance. The microstrip line 112 corresponds to approximately a two-quarter wavelength at the second harmonic frequency f2. The load impedance m26 at the second harmonic frequency f2 remains near 50Ω without substantial change. This portion near 50Ω is indicated as portion 4B in FIG. 4.

The characteristic impedance Zc13 of the microstrip line 113 is lower than the characteristic impedance Zc11 of the microstrip line 111. The electrical length EL13 at the fundamental frequency f1 is as short as approximately 28 degrees. Thus, as shown in FIG. 5, the load impedance m12 at the fundamental frequency f1 seen from the reference plane P3 is transformed to a portion 5A on the resistance of R=1Ω. The resistance of R=1Ω is the same value as the resistance component of the desired load impedance and provided to the high-frequency semiconductor amplifying element 14. The load impedance m22 at the second harmonic frequency f2 is transformed to a portion 5B different from the portion 5A. The electrical length at the fundamental frequency f1 is as short as approximately 28 degrees. Thus, the electrical length EL13 is less than or equal to a three-quarter wavelength also at the third harmonic frequency f3. Accordingly, the load impedance m32 at the third harmonic frequency f3 is transformed to a portion 5C different from the portion 5A and the portion 5B. That is, the load impedances m12, m22, and m32 at the fundamental frequency f1, the second harmonic frequency f2, and the third harmonic frequency f3 are separated.

The characteristic impedance Zc14 of the microstrip line 114 is higher than the characteristic impedance Zc13 of the microstrip line 113. The electrical length EL14 at the fundamental frequency f1 is approximately 15 degrees. The microstrip line 114 is added to the microstrip line 113. Thus, as shown in FIG. 6, the load impedance m13 at the fundamental frequency f1 seen from the reference plane P4 is transformed to a portion 6A near 1Ω. The load impedance m23 at the second harmonic frequency f2 is transformed to a portion 6B. The portion 6B is an inductive region near ∞Ω. The load impedance m33 at the third harmonic frequency f3 is transformed to a portion 6C. The portion 6C is inductive near ∞Ω and different from the portion 6B.

In the impedance chart of FIG. 6, an inductive impedance is indicated in the upper half region of the impedance chart. A capacitive impedance is indicated in the lower half region of the impedance chart.

The characteristic impedance Zc15 of the microstrip line 115 is close to the load impedance m13 at the fundamental frequency f1 seen from the reference plane P4. The microstrip line 115 is added to the microstrip line 114. Thus, as shown in FIG. 7, the load impedance m14 at the fundamental frequency f1 seen from the reference plane P5 remains near 1Ω without substantial change. This portion near 1Ω is indicated as portion 7A in FIG. 7. The load impedance m24 at the second harmonic frequency f2 is transformed to a portion 7B. The portion 7B is an inductive region near 0Ω. The load impedance m34 at the third harmonic frequency f3 is transformed to a portion 7C. The portion 7C is a capacitive region. At this stage, the load impedance m34 at the third harmonic frequency f3 is capacitive.

The wire part 116 is added to the microstrip line 115. Thus, as shown in FIG. 8, the load impedance m15 at the fundamental frequency f1 seen from the reference plane P6 is transformed to a portion 8A near (i+j1)Ω because of the added inductivity of the wire part 116. The load impedance m25 at the second harmonic frequency f2 remains near ∞Ω. This portion near ∞Ω is indicated as portion 8B in FIG. 8. The load impedance m35 at the third harmonic frequency f3 is transformed to a portion 8C near 0Ω due to resonance between the capacitivity in the aforementioned portion 7C and the inductivity of the wire part 116.

The amount of capacitivity produced by the addition of the microstrip line 115 may be smaller than the amount of inductivity of the wire part 116. In this case, the load impedance m35 at the third harmonic frequency f3 is not transformed to approximately 0Ω due to insufficient resonance between capacitivity and inductivity. The amount of capacitivity produced by the addition of the microstrip line 115 may be larger than the amount of inductivity of the wire part 116. Also in this case, the load impedance m35 at the third harmonic frequency f3 is not transformed to approximately 0Ω due to insufficient resonance between capacitivity and inductivity.

Thus, the electrical length EL15 of the microstrip line 115 needs to be selected so as to achieve resonance between the capacitivity produced by the addition of the microstrip line 115 and the inductivity of the wire part 116.

The high-frequency semiconductor amplifier 1 according to this embodiment has been described with reference to the example in which the load impedance at the fundamental frequency f1 seen from the reference plane P6 is transformed to approximately (1+j1)Ω. However, this embodiment is not limited thereto. The load impedance may be transformed to a different desired load impedance.

Next, the effect of the high-frequency semiconductor amplifier 1 according to this embodiment is described.

High power-added efficiency is achieved in the high-frequency semiconductor amplifier by an output matching circuit connected to the output of the high-frequency semiconductor amplifying element. Thus, the load impedance at the fundamental frequency is matched with a desired impedance. The load impedance at even harmonics such as the second harmonic frequency is set to ∞Ω. The load impedance at odd harmonics such as the third harmonic frequency is set to 0Ω. Such operation of the high-frequency semiconductor amplifier is referred to as inverse class-F operation. The inverse class-F operation of the high-frequency semiconductor amplifier eliminates the even harmonics of voltage and the odd harmonics of current. The voltage and the current both exist only at the fundamental frequency. This realizes high power-added efficiency.

In the high-frequency semiconductor amplifier 1 according to this embodiment, by the microstrip line 113, the load impedance m12 at the fundamental frequency f1 is transformed to the portion 5A shown in FIG. 5. The load impedance m22 at the second harmonic frequency f2 is transformed to the portion 5B shown in FIG. 5. The load impedance m32 at the third harmonic frequency f3 is transformed to the portion 5C shown in FIG. 5. The portions 5A, 5B, and 5C are separate. Thus, the load impedance m15 at the fundamental frequency f1 seen from the reference plane P6 is easily transformed to the final target of approximately (1+j1)Ω. The load impedance m25 at the second harmonic frequency f2 is easily transformed to the final target of approximately ∞Ω. The load impedance m35 at the third harmonic frequency f3 is easily transformed to the final target of approximately 0Ω.

By the microstrip line 115, the load impedance m14 at the fundamental frequency f1 remains near 1Ω. However, the load impedance m24 at the second harmonic frequency f2 is transformed to approximately ∞Ω. The load impedance m34 at the third harmonic frequency f3 is transformed to a capacitive region.

By the wire part 116, the load impedance m15 at the fundamental frequency f1 is transformed to approximately (1+j1)Ω. The load impedance m25 at the second harmonic frequency f2 is transformed to approximately ∞Ω. The load impedance m35 at the third harmonic frequency f3 is resonated with the inductivity of the wire part 116 and transformed to approximately 0Ω. As a result, high power-added efficiency can be achieved by the inverse class-F operation of the high-frequency semiconductor amplifier 1. The power-added efficiency can be improved by approximately 5-10%.

Figure 9:
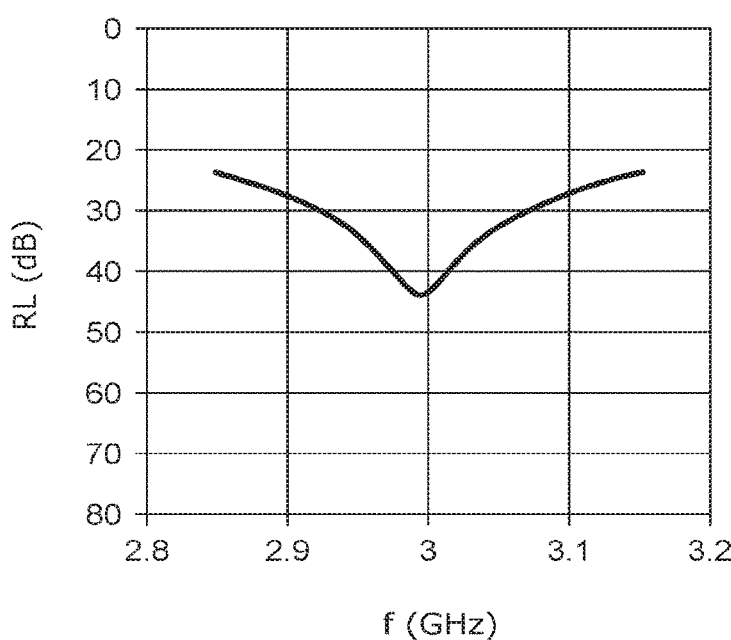
FIG. 9 is a graph illustrating the return loss RL seen from the reference plane P6 shown in FIG. 1.

FIG. 9 is a graph illustrating the return loss RL seen from the reference plane P6 shown in FIG. 1. In FIG. 9, the horizontal axis represents frequency f (GHz). The vertical axis represents the return loss RL (dB) for the load impedance m15 provided to the high-frequency semiconductor amplifying element 14. The load impedance m15 is e.g. (1+j1)Ω.

As shown in FIG. 9, the return loss RL at the fundamental frequency f1 can be set to 20 dB or more at frequency f of approximately 2.7-3.1 GHz.

Figure 17A:
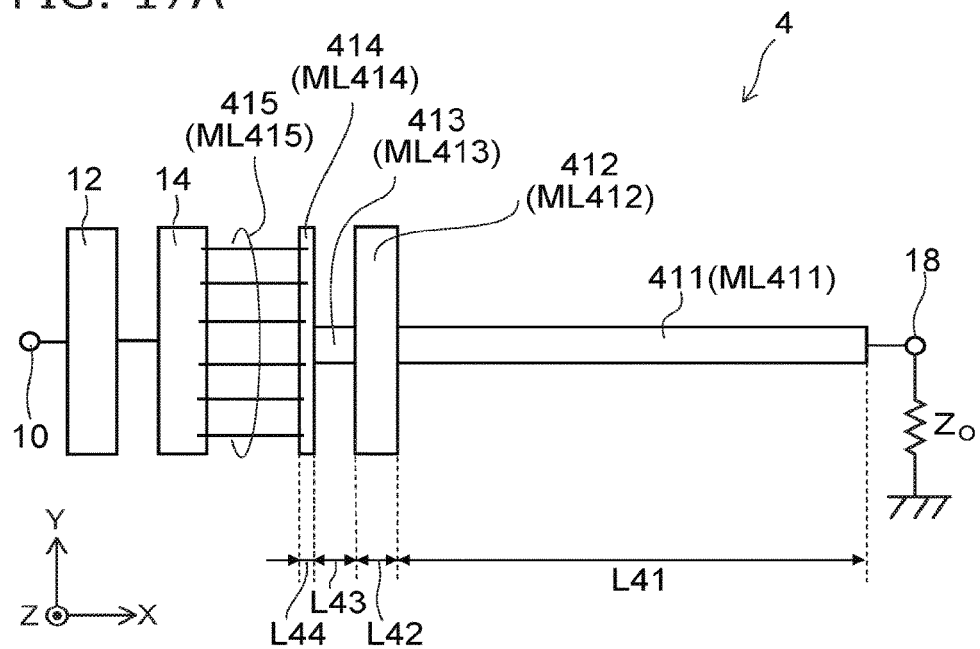
FIGS. 17A and 17B are schematic views showing the configuration of a high-frequency semiconductor amplifier according to a third comparative example of the first embodiment.

A high-frequency semiconductor amplifier for performing only the transformation of the load impedance for the fundamental uses a plurality of impedance transformation lines to lower a high impedance to the load impedance provided to the high-frequency semiconductor amplifying element 14. Thus, the characteristic impedance of the line is made sequentially lower with the decrease of the transformed impedance. As a result, the line width is also made sequentially wider. However, the high-frequency semiconductor amplifier 1 of this invention controls the load impedance for the second and third harmonics. Thus, the characteristic impedance $Zc14$ of the microstrip line 114 needs to be higher than the characteristic impedance $Zc13$ of the microstrip line 113 and the characteristic impedance $Zc15$ of the microstrip line 115. Accordingly, as in TABLE 4 shown in the third comparative example described later, if the microstrip line 412, the microstrip line 413, and the microstrip line 414 are formed on a substrate having the same permittivity and the same thickness, then the line width is not made sequentially wider, but a depression occurs as shown in FIG. 17A. Thus, while the substrate thickness and the relative permittivity of the substrate of the microstrip line 113 are selected from among commercially available ones, the substrate thickness is optimized. Accordingly, the line width W14 can be made comparable to the line width W13 and the line width W15. As a result, discontinuity in the pattern of microstrip lines is eliminated in the microstrip lines 113, 114, and 115. This can reduce unnecessary emission from the microstrip lines due to this discontinuity in the pattern.

Next, a first comparative example of the first embodiment is described.

Figure 10:
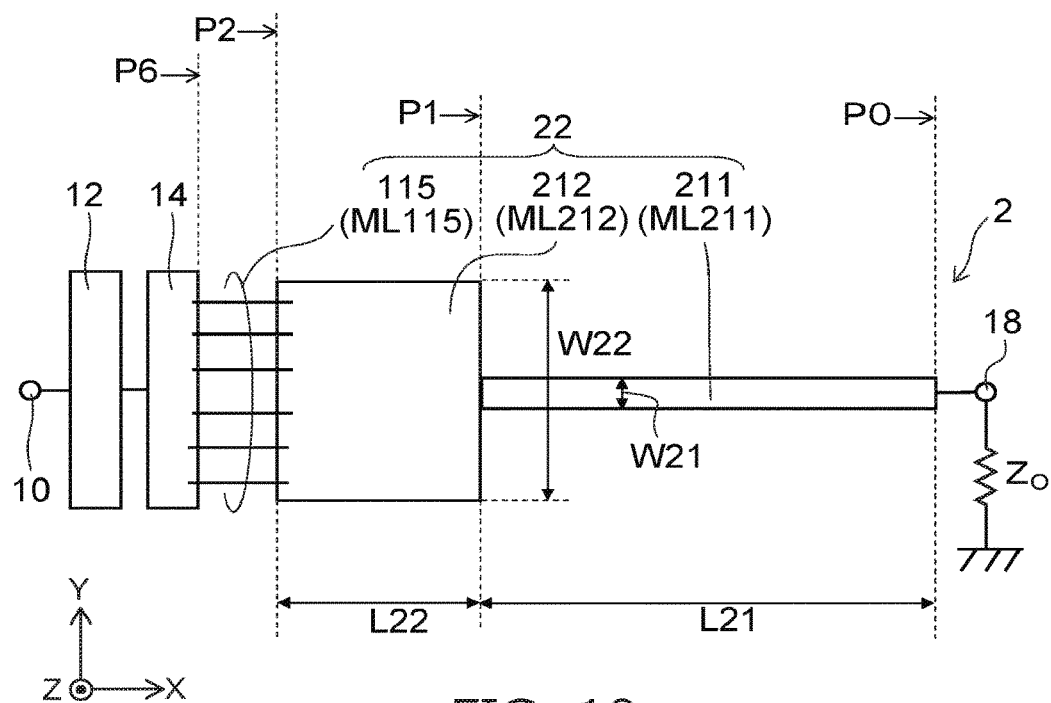
FIG. 10 is a schematic view showing the configuration of a high-frequency semiconductor amplifier according to a first comparative example of the first embodiment.

FIG. 10 is a schematic view showing the configuration of a high-frequency semiconductor amplifier according to this comparative example.

Figure 11:
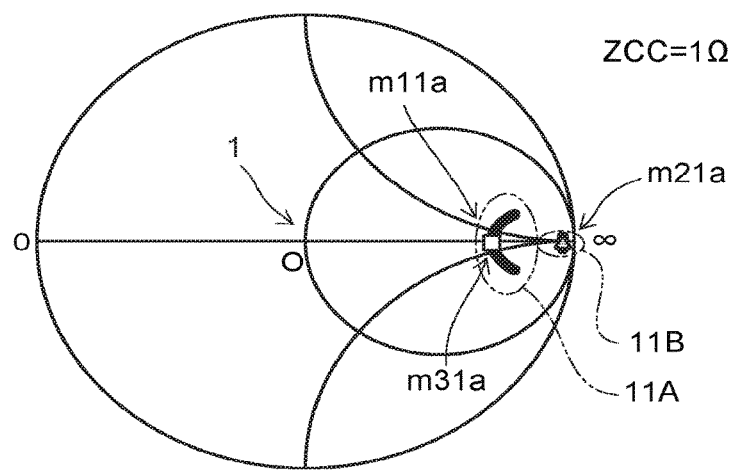
FIG. 11 is an impedance chart illustrating the load impedance seen from the reference plane P1 shown in FIG. 10.

FIG. 11 is an impedance chart illustrating the load impedance seen from the reference plane P1 shown in FIG. 10.

Figure 12:
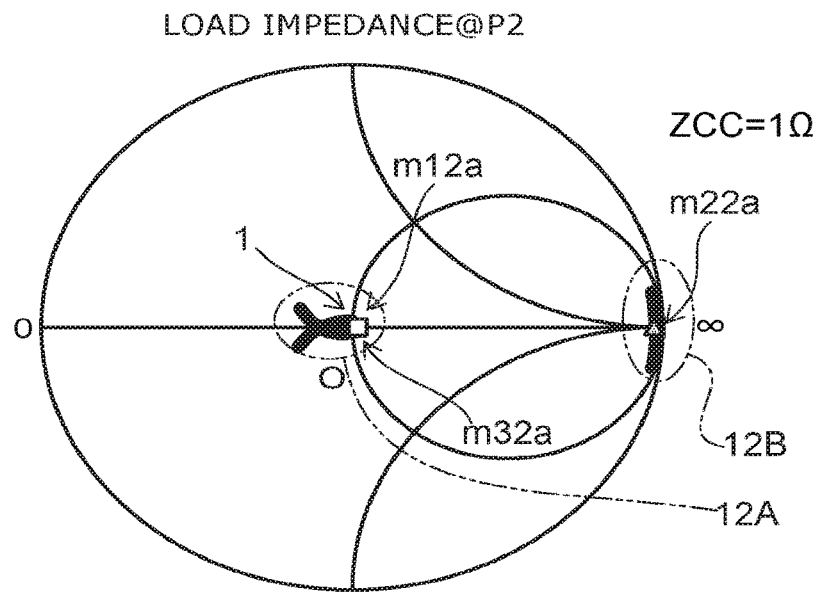
FIG. 12 is an impedance chart illustrating the load impedance seen from the reference plane P2 shown in FIG. 10.

FIG. 12 is an impedance chart illustrating the load impedance seen from the reference plane P2 shown in FIG. 10.

Figure 13:
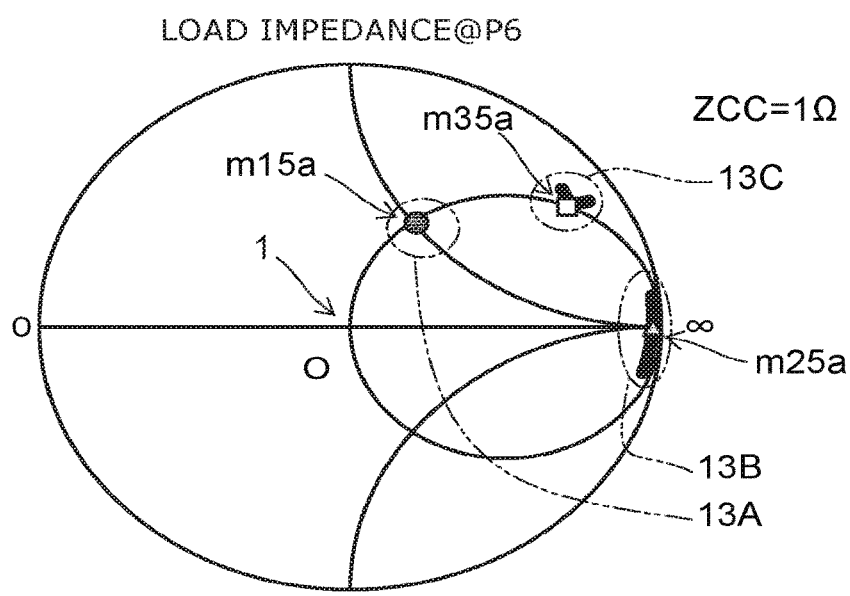
FIG. 13 is an impedance chart illustrating the load impedance seen from the reference plane P6 shown in FIG. 10.

FIG. 13 is an impedance chart illustrating the load impedance seen from the reference plane P6 shown in FIG. 10.

The impedance charts of FIGS. 11 to 13 are normalized so that the center point O represents 1Ω (ZCC=1Ω).

TABLE 2 is a table illustrating the electrical characteristics and dimensions of the microstrip lines in the first comparative example according to this embodiment.

|  | ML211 | ML212 |
|---|---|---|
| Zc21, 22 (Ω) | 18.80 | 2.66 |
| EL21, 22 (°) | 90.0 | 90.0 |
| εr21, 22 | 10 | 40 |
| t21, 22 (μm) | 150 | 250 |
| W21, 22 (mm) | 0.680 | 5.060 |
| L21, 22 (mm) | 8.830 | 4.140 |

As shown in FIG. 10, the output matching circuit 22 in this comparative example is formed from a microstrip line 211 (ML211), a microstrip line 212 (ML212), and a wire part 115. The position of the reference plane P0 is similar to the position in the above first embodiment. Thus, when the output terminal 18 side is seen from the reference plane P0, the load impedance m10 at the fundamental frequency f1 is similar to that of the above first embodiment (see FIG. 2). The load impedance m20 at the second harmonic frequency f2 is also similar to that of the above first embodiment (see FIG. 2). The load impedance m30 at the third harmonic frequency f3 is also similar to that of the above first embodiment (see FIG. 2).

The characteristic impedance $Zc21$ of the microstrip line 211 is 18.8Ω. The electrical length EL21 at the fundamental frequency f1 is 90 degrees. The relative permittivity εr21 is 10. The substrate thickness t21 is 150 μm. The line width W21 is 0.68 mm. The line length L21 is 8.83 mm. The characteristic impedance $Zc22$ of the microstrip line 212 is 2.66Ω. The electrical length EL22 at the fundamental frequency f1 is 90 degrees. The relative permittivity εr22 is 40. The substrate thickness t22 is 250 μm. The line width W22 is 5.06 mm. The line length L22 is 4.14 mm.

As shown in FIG. 11, when the output terminal 18 side is seen from the reference plane P1, the load impedance m11a at the fundamental frequency f1 and the load impedance m31a at the third harmonic frequency f3 are transformed to a portion 11A having an impedance higher than 1Ω and lower than 50Ω. The load impedance m21a at the second harmonic frequency f2 remains near 50Ω. This portion near 50Ω is indicated as portion 11B in FIG. 11.

As shown in FIG. 12, when the output terminal 18 side is seen from the reference plane P2, the load impedance m12a at the fundamental frequency f1 and the load impedance m32a at the third harmonic frequency f3 are transformed to a portion 12A having an impedance of approximately 1Ω. The load impedance m22a at the second harmonic frequency f2 remains near 50Ω. This portion near 50Ω is indicated as portion 12B in FIG. 12.

As shown in FIG. 13, when the output terminal 18 side is seen from the reference plane P6, the load impedance m15a at the fundamental frequency f1 is transformed to a portion 13A near (1+j1)Ω because of the added inductivity of the wire part 115. The load impedance m25a at the second harmonic frequency f2 is transformed to a portion 13B near ∞Ω. The load impedance m35a at the third harmonic frequency f3 is transformed to a portion 13C. The load impedance m25a at the second harmonic frequency f2 is set to approximately ∞Ω, but the load impedance m35a at the third harmonic frequency f3 is not set to approximately 0Ω. Thus, it is difficult to cause the high-frequency semiconductor amplifier 2 to perform the inverse class-F operation.

Next, a second comparative example of the first embodiment is described.

Figure 14:
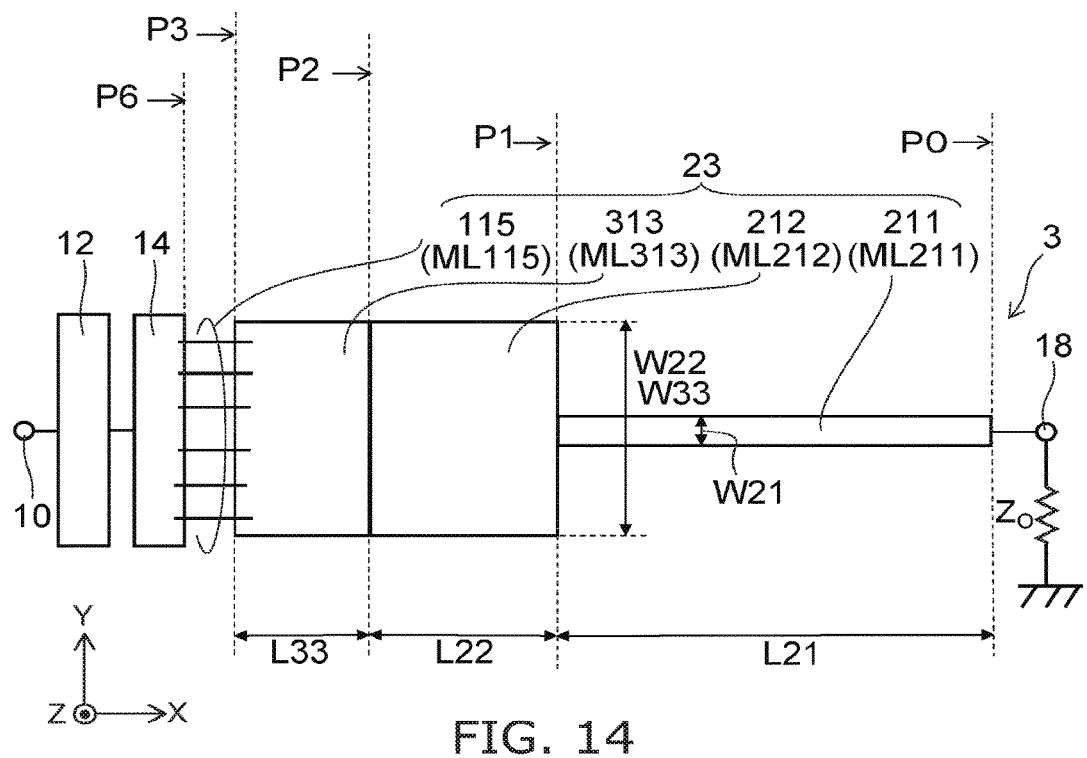
FIG. 14 is a schematic view showing the configuration of a high-frequency semiconductor amplifier according to a second comparative example of the first embodiment.

FIG. 14 is a schematic view showing the configuration of a high-frequency semiconductor amplifier according to the second comparative example of the first embodiment.

Figure 15:
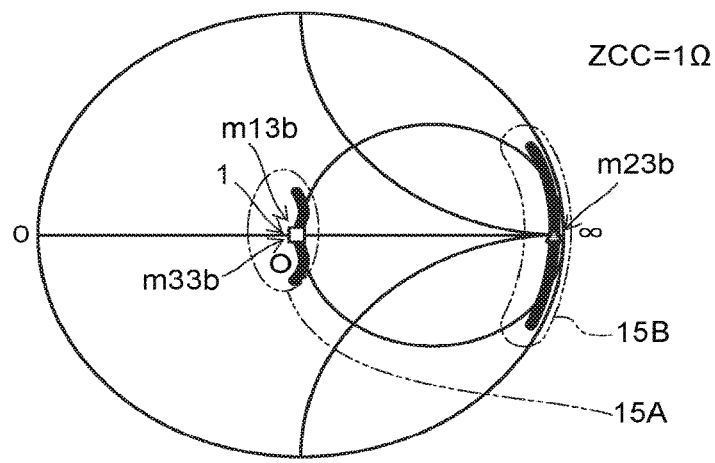
FIG. 15 is an impedance chart illustrating the load impedance seen from the reference plane P3 shown in FIG. 14.

FIG. 15 is an impedance chart illustrating the load impedance seen from the reference plane P3 shown in FIG. 14.

Figure 16:
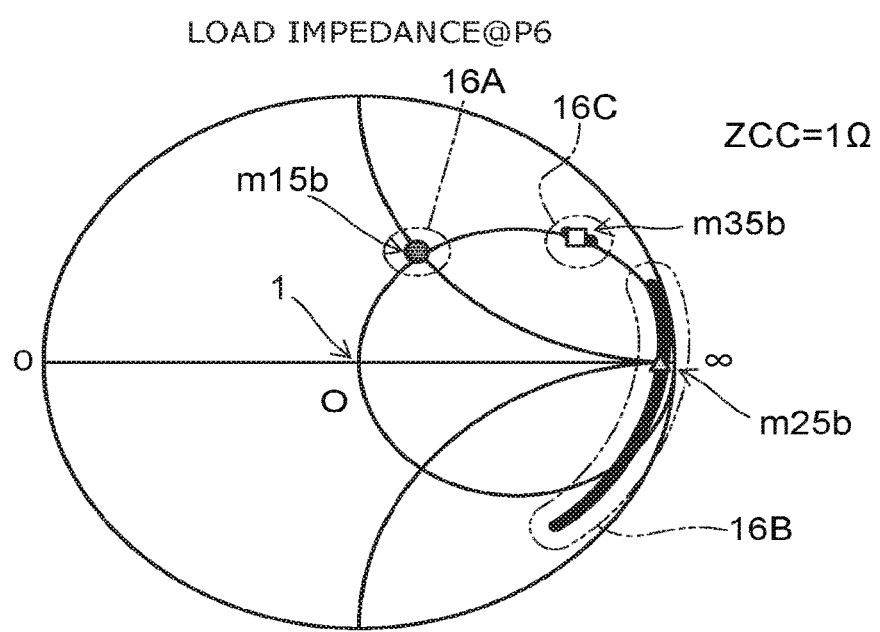
FIG. 16 is an impedance chart illustrating the load impedance seen from the reference plane P6 shown in FIG. 14.

FIG. 16 is an impedance chart illustrating the load impedance seen from the reference plane P6 shown in FIG. 14.

The impedance charts of FIGS. 15 and 16 are normalized so that the center point O represents 1Ω (ZCC=1Ω).

TABLE 3 is a table illustrating the electrical characteristics and dimensions of the microstrip lines in the second comparative example according to this embodiment.

|  | ML211 | ML212 | ML313 |
|---|---|---|---|
| Zc21, 22, 33 (Ω) | 18.80 | 2.66 | 1.00 |
| EL21, 22, 33 (°) | 90.0 | 90.0 | 90.0 |
| εr21, 22, 33 | 10 | 40 | 90 |
| t21, 22, 33 (μm) | 150 | 250 | 135 |
| W21, 22, 33 (mm) | 0.680 | 5.060 | 5.050 |
| L21, 22, 33 (mm) | 8.830 | 4.140 | 2.710 |

As shown in FIG. 14, the output matching circuit 23 in the second comparative example of this embodiment is different from the output matching circuit 22 in the above first comparative example in that the microstrip line 313 (ML313) is provided between the microstrip line 212 and the wire part 115. Thus, when the output terminal 18 side is seen from the reference planes P0, P1, and P2, the load impedances m10, m11, and m12 at the fundamental frequency f1 are similar to those of the above first comparative example. When the output terminal 18 side is seen from the reference planes P0, P1, and P2, the load impedances m20, m21, and m22 at the second harmonic frequency f2 are similar to those of the above first comparative example. When the output terminal 18 side is seen from the reference planes P0, P1, and P2, the load impedances m30, m31, and m32 at the third harmonic frequency f3 are similar to those of the above first comparative example. The characteristic impedance Zc33 of the microstrip line 313 is 1.0Ω. The electrical length EL33 at the fundamental frequency f1 is 90 degrees. The relative permittivity εr33 is 90. The substrate thickness t33 is 135 μm. The line width W33 is 5.05 mm. The line length L33 is 2.71 mm.

As shown in FIG. 15, when the output terminal 18 side is seen from the reference plane P3, the load impedance m13b at the fundamental frequency f1 remains near 1Ω as in the case seen from the reference plane P2. The load impedance m33b at the third harmonic frequency f3 also remains near 1Ω. This portion near 1Ω is indicated as portion 15A. In the case where the load impedance is located in the portion 15A, the phase can be adjusted by adding e.g. a strip line or wire. The load impedance m23b at the second harmonic frequency f2 is transformed to a portion 15B near ∞Ω. In the case where the load impedance is located near ∞Ω, the impedance is not substantially changed even if the phase is adjusted by adding e.g. a strip line.

As shown in FIG. 16, when the output terminal 18 side is seen from the reference plane P6, the load impedance m15b at the fundamental frequency f1 is transformed to a portion 16A near (1+j1)Ω because of the added inductivity of the wire part 115. The load impedance m25b at the second harmonic frequency f2 remains near ∞Ω without substantial change. This portion near ∞Ω is indicated as portion 16B in FIG. 16. The load impedance m35b at the third harmonic frequency f3 is transformed to a portion 16C because of the added inductivity of the wire part 115. As in the first comparative example, the load impedance m35b at the third harmonic frequency f3 is not set to approximately 0Ω. Thus, it is difficult to cause the high-frequency semiconductor amplifier 3 to perform the inverse class-F operation.

Next, a third comparative example of the first embodiment is described.

Figure 17B:
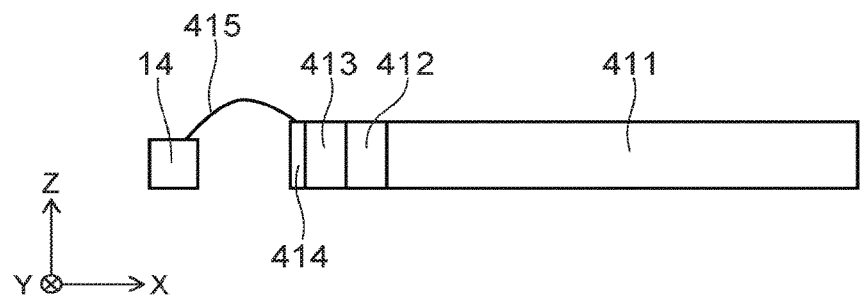

FIGS. 17A and 17B are schematic views showing the configuration of a high-frequency semiconductor amplifier according to the third comparative example of the first embodiment.

TABLE 4 is a table illustrating the electrical characteristics and dimensions of the microstrip lines in the third comparative example according to this embodiment.

|  | ML411 | ML412 | ML413 | ML414 |
|---|---|---|---|---|
| Zc41~44 (Ω) | 15.90 | 1.13 | 4.67 | 1.00 |
| EL41~44 (°) | 96.0 | 26.0 | 24.0 | 7.0 |
| εr41~44 | 10 | 90 | 90 | 90 |
| t41~44 (μm) | 150 | 135 | 135 | 135 |
| W41~44 (mm) | 0.846 | 4.440 | 0.903 | 5.052 |
| L41~44 (mm) | 9.310 | 0.790 | 0.780 | 0.210 |

As shown in TABLE 4, in the high-frequency semiconductor amplifier 4 according to this comparative example, the microstrip line 412 (ML412), the microstrip line 413 (ML413), and the microstrip line 414 (ML414) are formed on a substrate having the same permittivity and the same thickness. Then, as shown in FIG. 17A, the line width W43 of the microstrip line 413 is smaller than the line width W42 of the microstrip line 412. The line width W43 of the microstrip line 413 is smaller than the line width W44 of the microstrip line 414. The line width of the microstrip line 412, the microstrip line 413, and the microstrip line 414 is not constant, but a depression occurs. Thus, unnecessary radio waves are emitted from the microstrip line 412, the microstrip line 413, and the microstrip line 414.

The embodiment described above can provide a high-frequency semiconductor amplifier for amplifying high-frequency signals at high power-added efficiency.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A high-frequency semiconductor amplifier comprising:
an input terminal inputted with a fundamental signal having a first frequency band and a first center frequency in the first frequency band;
an input matching circuit including an input end and an output end, the input end of the input matching circuit being connected to the input terminal;
a high-frequency semiconductor amplifying element including an input end and an output end, the input end of the high-frequency semiconductor amplifying element being connected to the output end of the input matching circuit, and the high-frequency semiconductor amplifying element being configured to amplify the fundamental signal;
an output matching circuit including an input end and an output end, the input end of the output matching circuit being connected to the output end of the high-frequency semiconductor amplifying element; and
an output terminal connected to the output end of the output matching circuit,
the output matching circuit including:
  a first transmission line including an input end and an output end, the output end of the first transmission line being connected to the output end of the output matching circuit, the first transmission line having an electrical length of 72 degrees or more and 108 degrees or less at the first center frequency, and a characteristic impedance of the first transmission line being lower than 50Ω, which is a load impedance of an external load connected to the output terminal;
  a second transmission line including an input end and an output end, the output end of the second transmission line being connected to the input end of the first transmission line, the second transmission line having an electrical length of 72 degrees or more and 108 degrees or less at the first center frequency, and a characteristic impedance of the second transmission line being lower than the characteristic impedance of the first transmission line;
  a third transmission line including an input end and an output end, the output end of the third transmission line being connected to the input end of the second transmission line, the third transmission line having an electrical length of 24 degrees or more and 36 degrees or less at the first center frequency, and a characteristic impedance of the third transmission line being lower than the characteristic impedance of the second transmission line;
  a fourth transmission line including an input end and an output end, the output end of the fourth transmission line being connected to the input end of the third transmission line, the fourth transmission line having an electrical length of 12 degrees or more and 18 degrees or less at the first center frequency, a characteristic impedance of the fourth transmission line being lower than the characteristic impedance of the first transmission line, the characteristic impedance of the fourth transmission line being higher than the characteristic impedance of the third transmission line and a resistance of a desired load impedance provided to the high-frequency semiconductor amplifying element at a fundamental frequency, and a line width along a second direction of the fourth transmission line being 0.8 times or more and 1.2 times or less of a line width along the second direction of the third transmission line;
  a fifth transmission line including an input end and an output end, the output end of the fifth transmission line being connected to the input end of the fourth transmission line, the fifth transmission line having an electrical length of 12 degrees or more and 18 degrees or less at the first center frequency, and a characteristic impedance of the fifth transmission line being equal to the resistance of the desired load impedance provided to the high-frequency semiconductor amplifying element at the fundamental frequency; and
  a wire part including an input end and an output end, the output end of the wire part being connected to the input end of the fifth transmission line, and the input end of the wire part being connected to the input end of the output matching circuit.

2. The amplifier according to claim 1, wherein a relative permittivity of a substrate of the third transmission line is 1.6 times or more and 2.4 times or less of a relative permittivity of a substrate of the fifth transmission line.

3. The amplifier according to claim 2, wherein a relative permittivity of a substrate of the fourth transmission line is 0.08 times or more and 0.12 times or less of the relative permittivity of the substrate of the fifth transmission line.

4. The amplifier according to claim 2, wherein the characteristic impedance of the third transmission line is 0.8 times or more and 1.2 times or less of the characteristic impedance of the fifth transmission line.

5. The amplifier according to claim 2, wherein a substrate thickness along a third direction crossing the second direction of the fourth transmission line is 1.6 times or more and 2.4 times or less of a substrate thickness along the third direction of the second transmission line.

6. The amplifier according to claim 2, wherein a substrate thickness along a third direction crossing the second direction of the third transmission line is 0.8 times or more and 1.2 times or less of a substrate thickness along the third direction of the fourth transmission line.

7. The amplifier according to claim 1, wherein a relative permittivity of a substrate of the fourth transmission line is 0.08 times or more and 0.12 times or less of a relative permittivity of a substrate of the fifth transmission line.

8. The amplifier according to claim 7, wherein the characteristic impedance of the third transmission line is 0.8 times or more and 1.2 times or less of the characteristic impedance of the fifth transmission line.

9. The amplifier according to claim 1, wherein the characteristic impedance of the third transmission line is 0.8 times or more and 1.2 times or less of the characteristic impedance of the fifth transmission line.

10. The amplifier according to claim 1, wherein the line width along the second direction of the fourth transmission line is 0.8 times or more and 1.2 times or less of a line width along the second direction of the fifth transmission line.

11. The amplifier according to claim 1, wherein
  a relative permittivity of a substrate of the fourth transmission line is equal to a relative permittivity of a substrate of the second transmission line, and
  the relative permittivity of the substrate of the second transmission line is 0.08 times or more and 0.12 times or less of a relative permittivity of a substrate of the fifth transmission line.

12. The amplifier according to claim 1, wherein a relative permittivity of the fifth transmission line is higher than a relative permittivity of the fourth transmission line.

13. The amplifier according to claim 1, wherein the line width along the second direction of the third transmission line is 0.8 times or more and 1.2 times or less of a line width along the second direction of the fifth transmission line.

14. The amplifier according to claim 1, wherein the characteristic impedance of the fourth transmission line is higher than the characteristic impedance of the third transmission line.

* * * * *